(12) United States Patent
Martineau et al.

(10) Patent No.: US 10,418,938 B2
(45) Date of Patent: Sep. 17, 2019

(54) VOLTAGE-CONTROLLED OSCILLATOR

(71) Applicant: Commissariat à l'Energie Atomique et aux Energies Alternatives, Paris (FR)

(72) Inventors: Baudouin Martineau, Grenoble (FR); José-Luis Gonzalez Jimenez, Voreppe (FR); Aurélien Larie, Grenoble (FR)

(73) Assignee: COMMISSARIAT Á L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 227 days.

(21) Appl. No.: 15/446,069

(22) Filed: Mar. 1, 2017

(65) Prior Publication Data

US 2017/0257063 A1    Sep. 7, 2017

(30) Foreign Application Priority Data

Mar. 7, 2016    (FR) ...................... 16 51873

(51) Int. Cl.
| H03B 5/12 | (2006.01) |
| H03L 1/00 | (2006.01) |
| H03L 5/00 | (2006.01) |
| H03F 3/193 | (2006.01) |
| H01L 21/84 | (2006.01) |
| H03L 7/04 | (2006.01) |
| H03L 7/06 | (2006.01) |

(52) U.S. Cl.
CPC .......... *H03B 5/1234* (2013.01); *H01L 21/84* (2013.01); *H03B 5/1212* (2013.01); *H03B 5/1215* (2013.01); *H03B 5/1228* (2013.01); *H03B 5/1243* (2013.01); *H03B 5/1278* (2013.01); *H03F 3/193* (2013.01); *H03L 1/00* (2013.01); *H03L 5/00* (2013.01); *H03L 7/04* (2013.01); *H03L 7/06* (2013.01); *H03B 2200/004* (2013.01); *H03B 2200/009* (2013.01); *H03B 2200/0062* (2013.01); *H03B 2201/031* (2013.01)

(58) Field of Classification Search
CPC ..... H03L 5/00; H03L 1/00; H03L 7/04; H03L 7/06; H03F 3/193; H01L 21/84; H03B 5/1212
USPC ............................ 331/167, 117 FE, 185, 183
See application file for complete search history.

(56) References Cited

U.S. PATENT DOCUMENTS

| 8,149,067 B2 | 4/2012 | Okada |
| 8,710,937 B1 | 4/2014 | Sutardja |

(Continued)

FOREIGN PATENT DOCUMENTS

JP    2014183371 A    9/2014

OTHER PUBLICATIONS

Preliminary Search Report in French Patent Application No. 1651873; dated Dec. 1, 2016, 2 pages.

(Continued)

*Primary Examiner* — Arnold M Kinkead
(74) *Attorney, Agent, or Firm* — Moreno IP Law LLC

(57) ABSTRACT

A voltage-controlled oscillator, including a voltage-controlled LC resonator including at least one first output node; an amplifier including at least one first dual-gate MOS transistor including first and second gates, coupling the first output node to a second node of application of a reference potential; and a regulation circuit capable of applying to the second gate of the first transistor a bias voltage variable according to the amplitude of the oscillations of a signal delivered on the first output node of the oscillator.

14 Claims, 3 Drawing Sheets

(56) References Cited

U.S. PATENT DOCUMENTS

2007/0080754 A1     4/2007    Park et al.
2009/0134947 A1     5/2009    Tarng

OTHER PUBLICATIONS

Xu, Xiao et al.; 2.4-GHz Band Low-Voltage Class-C PMOS VCO IC with Amplitude Feedback Loop; 2015 Asia-Pacific Microwave Conference (APMC), IEEE; vol. 3; Dec. 6, 2015.

Yang, Xin et al.; A 0.3-V power supply 2.4-GHz-band Class-C VCO IC with amplitude feedback loop in 65-nm CMOS; Analog Integrated Circuits and Signal Processing, Springer New York LLC; vol. 81, No. 3; Jul. 10, 2014.

Wachi, Yusuke et al.; A 28GHx Low-Phase-Noise CMOS VCO Using an Amplitude-Redistribution Technique; ISCC 2008; Session 26; Wireless Frequency Generation; 26.6; Feb. 6, 2008.

Kwok, KaChun et al.; Ultra-Low-Voltage High-Performance CMOS VCOs Using Transformer Feedback; IEEE Journal of Solid-State Circuits; vol. 40, No. 3; Mar. 2005.

Hong, Jong-Phil et al.; Low Phase Noise Gm-Boosted Differential Gate-to-Source Feedback Colpitts CMOS VCO; IEEE Journal of Solid-State Circuits, vol. 44, No. 11; Nov. 2009.

Mazzanti, Andrea et al.; A 1.4mW 4.90-to-5.65GHz Class-C CMOS VCO with an Average FoM of 194.5dBc/Hz; ISCC 2008; Session 26; Wireless Frequency Generation; 26.2; Feb. 6, 2008.

Mazzanti, Andrea et al.; Class-C Harmonic CMOS VCOs, With a General Result on Phase Noise; IEEE Journal of Solid-State Circuits; vol. 43, No. 12; Dec. 2008.

Okada, Kenichi; A 0.114-mW Dual-Conduction Class-C CMOS VCO with 0.2-V Power Supply; Department of Physical Electronics, Tokyo Institute of Technology; Symposium on VLSI Circuits Digest of Technical Papers; 2009.

Takeuchi, Yasuaki et al; An Improved Dual-Conduction Class-C VCO Using a Tail Resistor; Department of Physical Electronics, Tokyo Institute of Technology; Proceedings of the 6th European Microwave Integrated Circuits Conference; 2011.

Tohidian, Massoud et al.; High-Swing Class-C VCO; IEEE; Oct. 2011.

Chen, Jian et al.; A Lower Power, Startup Ensured and Constant Amplitude Class-C VCO in 0.18 μm CMOS; IEEE; Jul. 14, 2011.

Deng, Wei et al.; Class-C VCO With Amplitude Feedback Loop for Robust Start-Up and Enhanced Oscillation Swing; IEEE Journal of Solid-State Circuits; vol. 48, No. 2; Feb. 2013.

VOLTAGE-CONTROLLED OSCILLATOR

CROSS-REFERENCE TO RELATED APPLICATION

This application claims the priority benefit of French patent application number 16/51873, the content of which is hereby incorporated by reference in its entirety to the maximum extent allowable by law.

BACKGROUND

The present disclosure relates to voltage-controlled oscillators, and more particularly to oscillators with an LC resonator. More specifically, the present disclosure aims at so-called class-C oscillators with an LC resonator.

DISCUSSION OF THE RELATED ART

Voltage-controlled oscillators are used in many applications, particularly to generate radio frequency signals or RF signals (that is, signals having a frequency in the range from 3 kHz to 300 GHz) in wire or wireless communication systems.

Oscillators with an LC resonator, that is, comprising an LC resonant circuit (or LC resonator) having a resonance frequency varying according to a voltage applied to a circuit control node and an amplifier circuit comprising at least one MOS transistor coupled with the LC resonator, are here more particularly considered.

More specifically, so-called class-C oscillators with an LC resonator, that is, where the gates of the MOS transistor(s) of the amplifier circuit are biased to a DC voltage smaller than the threshold voltage of the transistors so that the transistors behave as class-C amplifiers, are here considered.

SUMMARY

An embodiment provides a voltage-controlled oscillator, comprising a voltage-controlled LC resonator comprising at least one first output node; an amplifier comprising at least one first dual-gate MOS transistor comprising first and second gates, coupling the first output node to a second node of application of a reference potential; and a regulation circuit capable of applying to the second gate of the first transistor a bias voltage variable according to the amplitude of the oscillations of a signal delivered on the first output node of the oscillator.

According to an embodiment, the oscillator further comprises a circuit of application of a fixed bias voltage to the first gate of the first transistor.

According to an embodiment, the fixed and variable bias voltages are such that the amplifier has a class-A, -B, or -AB biasing during a start-up phase of the oscillator, and has a class-C biasing in steady state.

According to an embodiment, the first transistor is a transistor having a negative threshold voltage variation; and the variable bias voltage decreases as the amplitude of the oscillations increases.

According to an embodiment, the fixed bias voltage is greater than or equal to the minimum threshold voltage of the first transistor, and is smaller than the maximum threshold voltage of the first transistor.

According to an embodiment, the regulation circuit comprises a first circuit capable of supplying a first voltage representative of the envelope of the oscillations, and a second circuit capable of generating the variable bias voltage from the first voltage.

According to an embodiment, the first circuit comprises a second diode-assembled MOS transistor in series with a first capacitive element between the first output node and the second node.

According to an embodiment, the second circuit comprises first and second resistors series-connected between first and second electrodes of the first capacitive element, and a third resistor series-connected with a third MOS transistor between a third node of application of a power supply voltage and the second node, the gate of the third transistor being coupled to the junction point of the first and second resistors, and the junction point of the third resistor and of the third transistor being coupled to the second gate of the first transistor.

According to an embodiment, the resonator comprises an inductance and a series association of first and second variable-capacitance capacitive elements.

According to an embodiment, the LC resonator is a differential resonator further comprising a fourth output node; the amplifier comprises at least one fourth dual-gate MOS transistor comprising first and second gates, coupling the fourth output node to the second node; and the regulation circuit is capable of applying said variable bias voltage to the second gate of the second transistor.

According to an embodiment, the amplifier comprises second and third capacitive elements respectively coupling the first gate of the first transistor to the fourth output node and the first gate of the fourth transistor to the first output node.

The foregoing and other features and advantages will be discussed in detail in the following non-limiting description of specific embodiments in connection with the accompanying drawings.

DETAILED DESCRIPTION OF THE PRESENT EMBODIMENTS

Figure 1:
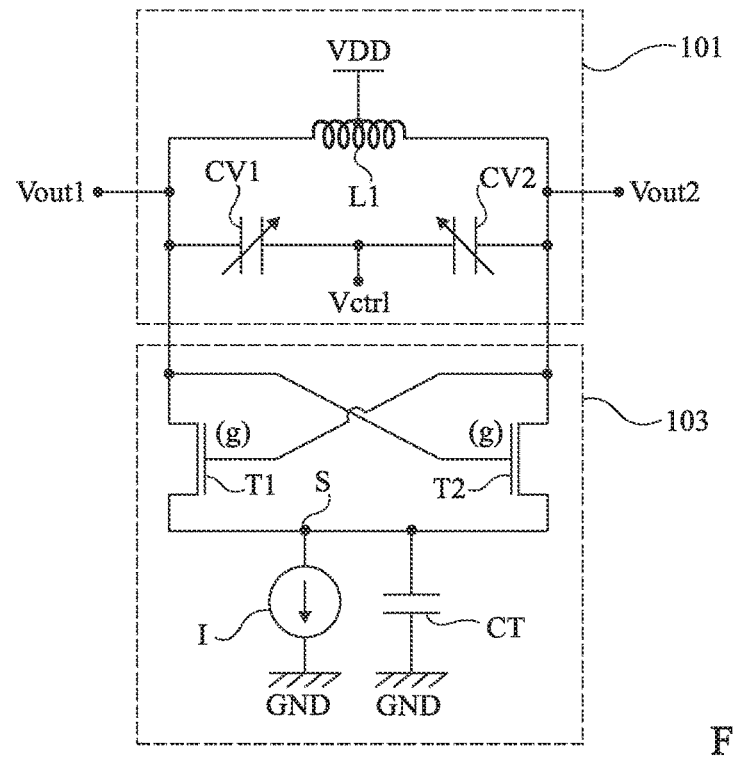
FIG. 1 is an electric diagram of an example of an oscillator with a parallel LC resonator.

The same elements have been designated with the same reference numerals in the different drawings. In the present description, term "connected" is used to designate a direct electric connection, with no intermediate electronic component, for example, by means of one or a plurality of conductive tracks, and term "coupled" or term "linked" is used to designate either a direct electric connection (then meaning "connected") or a connection via one or a plurality of intermediate components (resistor, capacitor, transistor, etc.). Unless otherwise specified, expressions "approximately", "substantially", and "in the order of" mean to within 10%, preferably to within 5%.

FIG. 1 is an electric diagram of an example of an oscillator with a parallel LC resonator.

The oscillator of FIG. 1 comprises a parallel LC resonator 101 coupled between two output nodes $V_{out1}$ and $V_{out2}$ of the oscillator. Resonator 101 comprises an inductance L1 having a first end coupled (connected in the shown example) to node $V_{out1}$ and having its second end coupled (connected in the shown example) to node $V_{out2}$, the midpoint of inductance L1 being coupled to a node $V_{DD}$ of application of a fixed (DC) power supply voltage. Resonator 101 further comprises, in parallel with inductance L1, two variable-capacitance capacitive elements CV1 and CV2, for example, series-coupled variable-capacitance capacitors. More particularly, in the shown example, capacitive element CV1 has a first electrode connected to the first end of inductance L1 and a second electrode connected to a first electrode of capacitive element CV2, and capacitive element CV2 has a second electrode connected to the second end of inductance L1. The values of the capacitances of elements CV1 and CV2 vary according to a control voltage applied to a control node $V_{ctrl}$ of the resonator, in the shown example, the junction point of elements CV1 and CV2. In this example, the DC power supply voltage applied to node $V_{DD}$ and the control voltage applied to node $V_{ctrl}$ are referenced to a node GND of application of a reference potential of the oscillator, for example, the ground.

The oscillator of FIG. 1 further comprises an amplifier circuit 103 coupled in parallel with the LC resonator. Circuit 103 comprises a pair of MOS transistors T1 and T2, in the shown example, N-channel transistors. Transistors T1 and T2 are for example identical to each other, to within manufacturing dispersions. Transistor T1 couples node $V_{out1}$ to node GND via its conduction nodes (drain and source), and transistor T2 couples node $V_{out2}$ to node GND via its conduction nodes. More particularly, in the shown example, the drain of transistor T1 is connected to node $V_{out1}$, the drain of transistor T2 is connected to node $V_{out2}$, and the sources of transistors T1 and T2 are connected to a same node S coupled to node GND. In this example, node S is coupled to node GND on the one hand by a current source I, and on the other hand by a capacitive element CT, for example, a capacitor, connected in parallel with current source I. Transistors T1 and T2 form a crossed differential pair, that is, the gate (g) of transistor T1 is coupled (in this example, connected) to the drain of transistor T2, and the gate (g) of transistor T2 is coupled (in this example, connected) to the drain of transistor T1.

The oscillator of FIG. 1 operates as follows. Amplifier circuit 103 behaves as a negative resistor coupled in parallel with resonator 101, supplying power to resonator 101 to compensate for the inner resistance thereof. In steady state, amplifier circuit 103 ensures the holding of the oscillations of resonator 101, output nodes $V_{out1}$ and $V_{out2}$ supplying two AC voltages substantially of same frequency (equal to the resonance frequency of resonator 101) and of same amplitude, but in phase opposition. Calling L the total inductance of resonator 101 and C the total capacitance of resonator 101, oscillation frequency f of circuit 101 can be expressed as follows: $f=1/2\pi\sqrt{LC}$. This output frequency is voltage-controllable via node $V_{ctrl}$.

The architecture of FIG. 1 has the advantage of having a robust start-up and of being simple to implement.

Figure 2:
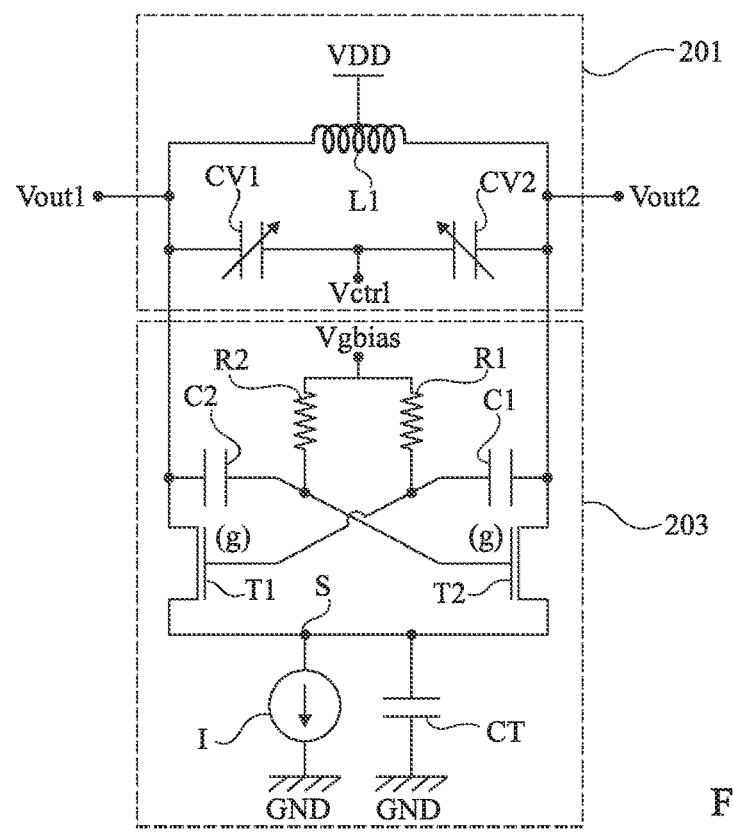
FIG. 2 is an electric diagram of an example of a class-C oscillator with a parallel LC resonator.

FIG. 2 is an electric diagram of an example of a class-C oscillator with a parallel LC resonator.

The oscillator of FIG. 2 comprises a parallel LC resonator 201 coupled between two output nodes $V_{out1}$ and $V_{out2}$ of the oscillator.

Resonator 201 is for example identical to resonator 101 described in relation with FIG. 1.

The oscillator of FIG. 2 further comprises an amplifier circuit 203 coupled in parallel with the LC resonator. In this example, amplifier circuit 203 comprises the same elements as amplifier circuit 103 of FIG. 1, arranged substantially in the same way, but differs from circuit 103 in that the gates (g) of transistors T1 and T2 are not directly connected to the drains of transistors T1 and T2. Circuit 203 indeed comprises a capacitive decoupling element C1, for example, a capacitor, coupling the gate of transistor T1 to the drain of transistor T2, and a capacitive decoupling element C2, for example, identical to element C1 to within manufacturing dispersions, coupling the gate of transistor T2 to the drain of transistor T1. Circuit 203 further comprises a circuit of application of a DC bias voltage to the gates of transistors T1 and T2. More particularly, in this example, the gate of transistor T1 is coupled to a node $V_{gbias}$ of application of a DC bias voltage via a resistor R1, and the gate of transistor T2 is coupled to node $V_{gbias}$ via a resistor R2, for example, identical to resistor R1 to within manufacturing dispersions. Capacitive elements C1 and C2 are capable of preventing the transmission, onto output nodes $V_{out1}$ and $V_{out2}$ of the oscillator, of the DC bias voltage applied to node $V_{gbias}$, while transmitting onto the gates of transistors T1 and T2 the AC voltage delivered to output nodes $V_{out1}$ and $V_{out2}$ of the oscillator.

The operation of the oscillator of FIG. 2 is similar to that of the oscillator of FIG. 1, to within the fact that, in the example of FIG. 2, a DC bias voltage $V_{gbias}$ smaller than threshold voltage $V_{th}$ of transistors T1 and T2 is applied to the gates of transistors T1 and T2 (via node $V_{gbias}$), so that transistors T1 and T2 behave as class-C amplifiers, that is, they have a conduction angle smaller than 180° of the phase of the amplifier signal (that is, the output oscillating signal of resonator LC).

The class-C biasing of amplifier circuit 203 enables to decrease both the phase noise and the power consumption of the oscillator as compared with architectures having a class-A operation of the type described in relation with FIG. 1.

The gain in terms of phase noise and of power consumption is all the higher as the bias voltage applied to the gates of transistors T1 and T2 is low. However, the application of too low a bias voltage to the gates of transistors T1 and T2 may prevent the starting of the oscillator.

To attempt satisfying these two contradictory aims (a) start-up robustness and b) decreased phase noise and power consumption), various class-C oscillator architectures with parallel LC resonators have been provided, particularly in articles "A 0.114-mW dual-conduction class-C CMOS VCO with 0.2-V power supply" of K. Okada et al. (IEEE Symp. VLSIC, 2009, pp. 228-229), "An improved dual-conduction class-C VCO using a tail resistor" of Y. Takeuchi et al. (IEEE EuMIC, 2011, pp. 204-207), "High-swing class-C VCO" of M. Tohidian et al. (IEEE ESSCIRC, 2011, pp. 49.5-498), "A low power, start-up ensured and constant amplitude class-C VCO in 0.18 mCMOS" of J. Chen et al. (IEEE Microwave. Wireless Compon. Lett., vol. 21, no. 8, pp. 427-429, August 2011), and "Class-C VCO With Amplitude Feedback Loop for Robust Start-Up and Enhanced Oscillation Swing" of Wei Deng et al. (IEEE Journal of Solid-State Circuits, vol. 48, no. 2, pp. 429-440, February 2013), as well as in U.S. Pat. No. 8,149,067 and U.S. Pat. No. 8,710,937.

The solutions described in these publications have the common point of applying to the gates of the MOS transistors of the amplifier circuit a first bias voltage for the start-up phase, and a second bias voltage smaller than the first voltage for the operation in steady state. The provided architectures are however complex. In particular, solutions providing a dynamic adjustment of the bias voltage applied to the gates of the MOS transistors of the amplifier circuit have the disadvantage of being invasive, since the gates of the MOS transistors of the amplifier circuit also receive the oscillating AC signal to be amplified. Thus, a malfunction of the circuits for controlling the bias voltage of the MOS transistors may cause a stopping of the oscillations and make the circuit unusable. Further, in the solutions described in the above-mentioned publications, to take into account, in particular, manufacturing and temperature dispersions, a security margin should be taken in the selection of the transistor bias point, to avoid risking an unwanted stopping of the oscillations. As a result, the optimal bias point in terms of phase noise and of power consumption cannot be reached.

Figure 3:
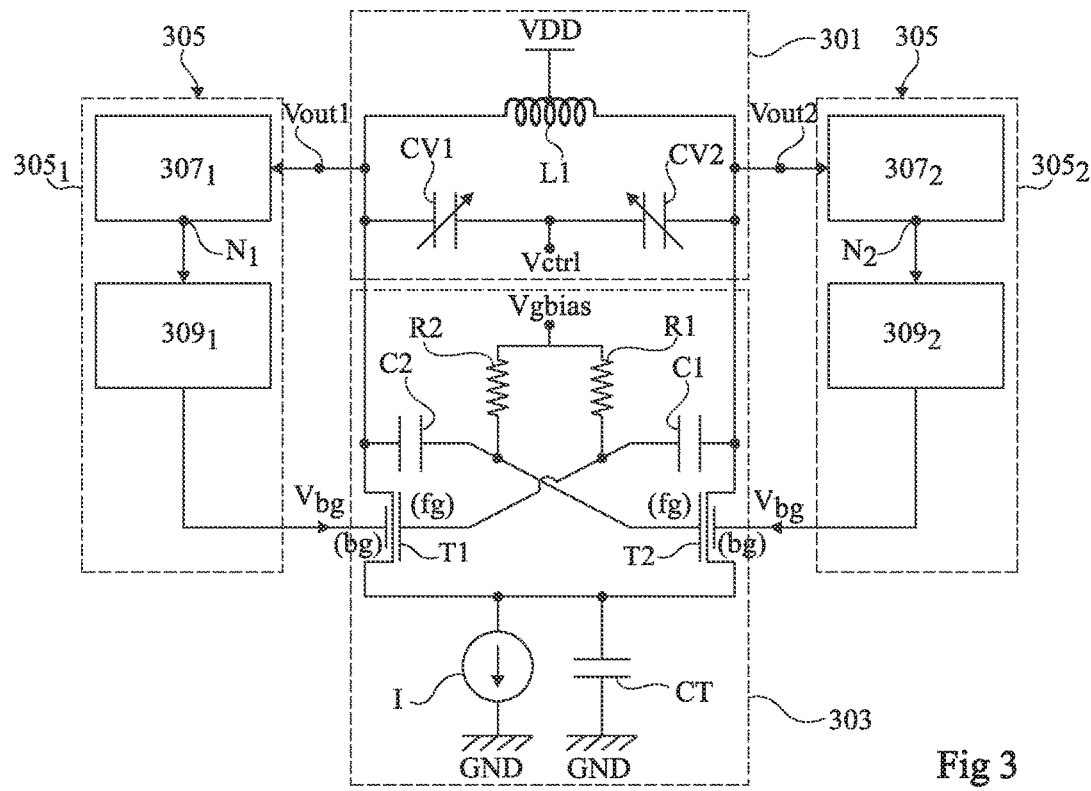
FIG. 3 is a simplified electric diagram illustrating an embodiment of a class-C oscillator with a parallel LC resonator.

FIG. 3 is a simplified electric diagram illustrating an embodiment of a class-C oscillator with a parallel LC resonator.

The oscillator of FIG. 3 comprises a parallel LC resonator 301 coupled between output nodes $V_{out1}$ and $V_{out2}$ of the oscillator. Resonator 301 is for example identical to resonator 201 of FIG. 2.

The oscillator of FIG. 3 further comprises an amplifier circuit 303, coupled in parallel with resonator 301. Amplifier circuit 303 of FIG. 3 is identical or similar to amplifier circuit 203 of FIG. 2, to within the fact that, in circuit 303 of FIG. 3, MOS transistors T1 and T2 are dual-gate MOS transistors.

Dual-gate MOS transistor here means a transistor comprising a channel-forming region laterally bordered, on the one hand, with a source region and, on the other hand, with a drain region, and further comprising a first control gate or front gate (fg), arranged above the channel-forming region and insulated from the channel-forming region by a dielectric layer, and a second control gate or back gate (bg), arranged under the channel-forming region. In such a transistor, the current flowing between the drain and the source of the transistor is a function not only of the potential applied to the front gate of the transistor, but also of the potential applied to the back gate thereof. In particular, the threshold voltage of the transistor, that is, the minimum voltage to be applied between the front gate and the source of the transistor to turn on the transistor, depends on the potential applied to the back gate of the transistor.

Transistors T1 and T2 are for example SOI-type ("semiconductor on insulator") transistors, the back gate being then insulated from the channel-forming region by a dielectric layer. Preferably, transistors T1 and T2 are FDSOI-type ("Fully Depleted Semiconductor On Insulator") transistors, that is, SOI transistors where the channel-forming region is fully depleted when the transistor is not biased. Indeed, in a FDSOI transistor, the variations of the control potential applied to the back gate of the transistor cause significant variations of the transistor threshold voltage, which is particularly adapted to the implementation of the embodiments which will be described, as will more clearly appear from the following description. The described embodiments are however not limited to the case where transistors T1 and T2 are of SOI or FDSOI type. More generally, the described embodiments apply to any types of MOS transistors with two control gates respectively arranged on the front side and on the back side of the channel-forming region of the transistor. As an example, the described embodiments are compatible with "bulk"-type MOS transistors, comprising a semiconductor bulk region arranged under the channel-forming region, having its upper surface in contact with the lower surface of the channel-forming region. In this case, the back gate is formed by the transistor bulk region, and is not insulated from the channel-forming region. As a variation, transistors T1 and T2 may be FinFET-type transistors.

The assembly of transistors T1 and T2 of FIG. 3 is similar to what has been described in relation with FIG. 2, the gates (g) of transistors T1 and T2 of the circuit of FIG. 2 being replaced with the front gates (fg) of transistors T1 and T2 in the circuit of FIG. 3.

The oscillator of FIG. 3 further comprises a regulation circuit 305 coupled, on the one hand, to output nodes $V_{out1}$ and $V_{out2}$ of the oscillator and, on the other hand, to the back gates (bg) of transistors T1 and T2. Circuit 305 is capable of applying to the back gates (bg) of transistors T1 and T2 a DC bias voltage $V_{bg}$ which is a function of the amplitude of the oscillations of the output signal of the oscillator. More particularly, in this example, dual-gate transistors T1 and T2 are transistors having a negative threshold voltage variation, that is, the higher the bias voltage applied to their back gate, the lower their threshold voltage. In this case, circuit 305 is configured to apply to the back gates of transistors T1 and T2 a bias voltage $V_{bg}$ which decreases as the oscillation amplitude increases. As an example, circuit 305 is configured to apply to the back gates of transistors T1 and T2 a voltage $V_{bg}$ which continuously decreases according to the oscillation amplitude, between a maximum value $V_{bgmax}$ when the oscillation amplitude is zero, and a minimum value $V_{bgmin}$ when the oscillation amplitude reaches its maximum value. Value $V_{bgmax}$ is smaller than or equal to the maximum nominal back side bias voltage that transistors T1 and T2 can withstand, and value $V_{bgmin}$ is smaller than value $V_{bgmax}$ and greater than or equal to 0 V.

In operation, a fixed DC bias voltage is applied to the front gates of transistors T1 and T2, via node $V_{gbias}$. Voltage $V_{gbias}$ is preferably selected to be greater than or equal to minimum threshold voltage $V_{thmin}$ of transistors T1 and T2, that is, the threshold voltage of transistors T1 and T2 when their back gates are biased to voltage $V_{bgmax}$. Thereby, transistors T1 and T2 have a class-B, -AB, or -A biasing at the starting of the oscillator, that is, when the amplitude of the oscillations of the output signal is zero. This guarantees a robust start-up of the oscillator.

When the oscillator starts, an oscillating signal appears on its output nodes $V_{out1}$, $V_{out2}$. Circuit 305 then continuously modifies the bias voltage $V_{bg}$ applied to the back gates of transistors T1 and T2 according to the amplitude of the oscillations of the signal delivered to nodes $V_{out1}$, $V_{out2}$. In steady state, voltage $V_{bg}$ reaches its minimum value $V_{bgmin}$, and the threshold voltage of transistors T1 and T2 accordingly reaches its maximum value $V_{thmax}$. The fixed bias voltage $V_{gbias}$ applied to the front gates (fg) of transistors T1 and T2 is selected to be smaller than maximum threshold voltage $V_{thmax}$ of transistors T1 and T2, to obtain a class-C biasing of transistors T1 and T2 in steady state.

In the shown example, circuit 305 comprises a first sub-circuit $305_1$ connected, on the one hand, to node $V_{out1}$ and, on the other hand, to the back gate (bg) of transistor T1, and a second sub-circuit $305_2$ connected, on the one hand, to node $V_{out2}$ and, on the other hand, to the back gate (bg) of transistor T2. In this example, sub-circuit $305_1$ comprises a rectifying and filtering circuit $307_1$, or envelope detection circuit, connected to node $V_{out1}$ and capable of delivering, on an output node $N_1$, a voltage representative of the envelope of the oscillating signal present on node $V_{out1}$. Sub-circuit $305_1$ further comprises a shaping circuit $309_1$ connected to node $N_1$ and capable of applying, to the back gate (bg) of transistor T$_1$, a bias voltage which is a function of the amplitude of the envelope signal delivered by envelope detector 307$_1$ to node N$_1$. Similarly, sub-circuit 305$_2$ comprises a rectifying and filtering circuit 307$_2$, or envelope detection circuit, connected to node V$_{out2}$ and capable of delivering, on an output node N$_2$, a voltage representative of the envelope of the oscillating signal present on node V$_{out2}$. Sub-circuit 305$_2$ further comprises a shaping circuit 309$_2$ connected to node N$_2$ and capable of applying, to the back gate (bg) of transistor T2, a bias voltage which is a function of the amplitude of the envelope signal delivered by envelope detector 307$_2$ to node N$_2$. Sub-circuits 305$_1$ and 305$_2$ are for example identical, to within manufacturing dispersions. In practice, the bias voltage applied to the back gate (bg) of transistor T1 is substantially identical to the bias voltage applied to the back gate (bg) of transistor T2. As a variation, only one of the two sub-circuits 305$_1$ and 305$_2$ may be provided, and the output of this sub-circuit may be connected both to the back gate (bg) of transistor T1 and to the back gate (bg) of transistor T2. The arrangement shown in FIG. 3 comprising two separate identical sub-circuits 305$_1$ and 305$_2$ for the biasing of transistors T1 and T2 is however preferably since it enables to symmetrize the load seen by output nodes V$_{out1}$ and V$_{out2}$ of the resonator.

Figure 4:
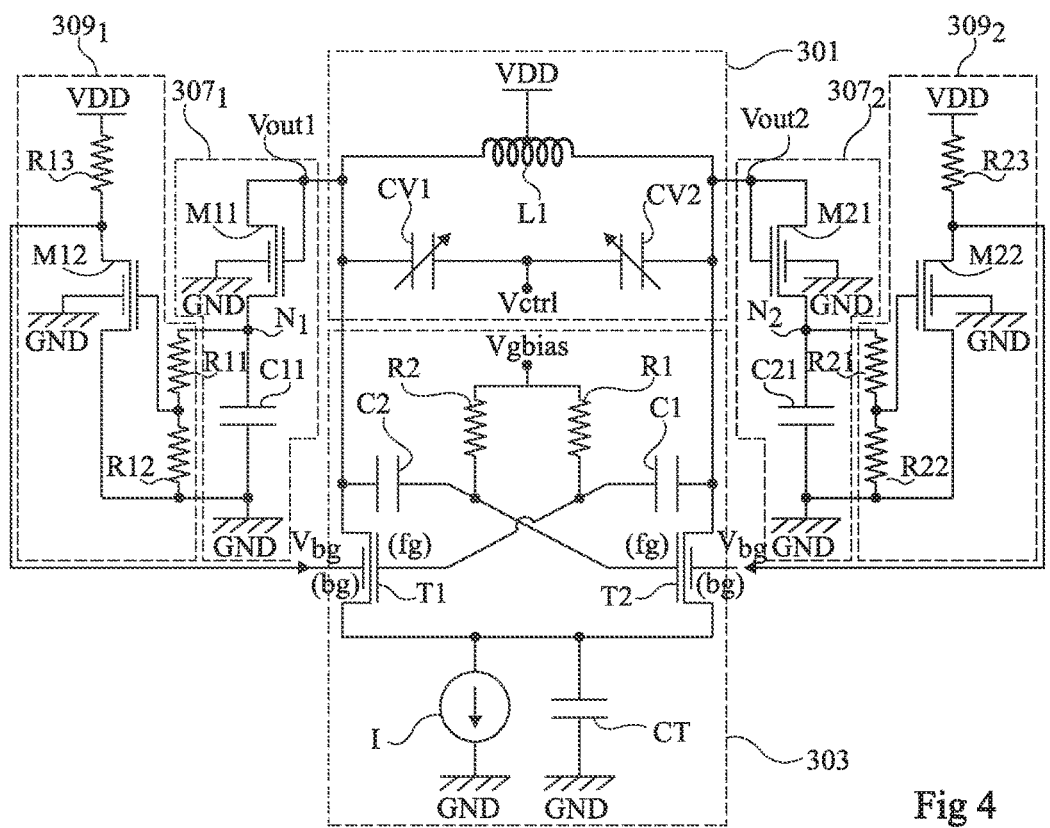
FIG. 4 is an electric diagram showing in further detail an embodiment of a class-C oscillator with a parallel LC resonator of the type described in relation with FIG. 3.

FIG. 4 is an electric diagram shown in further detail an example of implementation of the oscillator of FIG. 3. More particularly, FIG. 4 shows in further detail an embodiment of regulation circuit 305 of the oscillator of FIG. 3.

In this example, envelope detection circuit 307$_1$ of sub-circuit 305$_1$ comprises a diode-assembled MOS transistor M11, which couples node V$_{out1}$ to node N1. In this example, transistor M11 is an N-channel transistor, having its conduction nodes respectively connected to node V$_{out1}$ and to node N1, and having its gate connected to node V$_{out1}$. Transistor M11 may be a single-gate or a dual-gate transistor. In the shown example, transistor M11 is a dual-gate transistor having its back gate connected to ground (node GND) and having its front gate connected to node V$_{out1}$. Envelope detection circuit 307$_1$ further comprises a capacitive element C11, for example, a capacitor, connected between node N$_1$ and node GND.

Shaping circuit 309$_1$ comprises two resistors R11 and R12 series-connected between node N1 and node GND, in parallel with capacitive element C11 of circuit 307$_1$. Resistors R11 and R12 form a first voltage dividing bridge lowering the level of the envelope voltage delivered by circuit 307$_1$ on node N$_1$. Circuit 309$_1$ further comprises a resistor R13 series-connected with a MOS transistor M12 between nodes VDD and GND. More particularly, in the shown example, transistor M12 is an N-channel transistor having its drain coupled to node VDD via resistor R13 and having its source connected to node GND. The gate of transistor M12 is coupled to the output node of the voltage dividing bridge formed by resistors R11 and R12, that is, to the junction point of resistors R11 and R12. Transistor M12 may be a single-gate transistor or a dual-gate transistor. In the shown example, transistor M12 is a dual-gate transistor having its back gate connected to ground (node GND) and having its front gate connected to the junction point of resistors R11 and R12. Resistor R13 and transistor M12 form together a second resistive voltage dividing bridge delivering a voltage having a level which is all the lower as the resistance of transistor M12 is low, that is, as the voltage level on node N1 is high. The output node of the voltage dividing bridge formed by resistor R13 and transistor M12, that is, the junction point of resistor R13 and of transistor M12, is connected to the back gate (bg) of transistor T1.

Similarly, envelope detection circuit 307$_2$ of sub-circuit 305$_2$ comprises a diode-assembled MOS transistor M21, coupling node V$_{out1}$ to node N$_2$, and a capacitive element C21 connected between node N$_2$ and node GND. Further, shaping circuit 309$_2$ comprises two resistors R21 and R22 series-connected between node N$_2$ and node GND, in parallel with capacitive element C21. Circuit 309$_2$ further comprises a resistor R23 series-connected with a MOS transistor M22 between nodes VDD and GND, the gate of transistor M22 being coupled to the junction point of resistors R21 and R22, and the junction point of resistor R23 and of transistor M22 being coupled to the back gate (bg) of transistor T2.

An advantage of the embodiments described in relation with FIGS. 3 and 4 is the self-regulation of the bias point of transistors T1 and T2. Indeed, circuit 305 automatically places the bias point of transistors T1 and T2 at an optimal level in terms of power consumption, while preventing any risk of interrupting the oscillations. In particular, when the bias voltage V$_{bg}$ applied by circuit 305 to the back gate of transistors T1 and T2 becomes too low, the amplitude of the oscillations of the output signal of resonator 301 starts decreasing, which results in increasing back voltage V$_{bg}$ and thus in restoring the amplitude of the oscillations. Thus, in steady state, bias voltage V$_{bg}$ automatically settles at an optimal level in terms of power consumption and of phase noise. This is a noticeable difference with respect to the above-mentioned publications where a security margin has to be provided in the selection of the class-C bias point of transistors, to take into account possible manufacturing and/or temperature dispersions.

Another advantage of the described embodiments is that the dynamic adjustment of the bias point of transistors T1 and T2 in order to, in a first phase, satisfy the oscillator start-up conditions and, in a second phase, obtain a class-C operation providing a good performance in terms of phase noise and of power consumption, is performed via the back gates of transistors T1 and T2. Thus, regulation circuit 305 is non-invasive, since the bias voltage dynamically modified by circuit 305 is not superimposed to the high-frequency oscillating signal to be amplified. Bias voltage V$_{gbias}$ applied to the front gate of transistors T1 and T2 remains constant during the oscillator operation.

Specific embodiments have been described. Various alterations, modifications, and improvements will occur to those skilled in the art. In particular, the described embodiments are not limited to the example of parallel LC resonators 301 shown in FIGS. 3 and 4. More generally, the described embodiments are compatible with any other parallel LC resonator architecture having a voltage-controlled resonance frequency.

Further, the described embodiments are not limited to the specific example of layout of amplifier circuit 303 shown in FIGS. 3 and 4. More generally, the embodiments are compatible with other architectures of an amplifier circuit comprising a crossed differential pair of dual-gate MOS transistors.

Further, the described embodiments are not limited to the specific examples of implementation of regulation circuit 305 described in relation with FIGS. 3 and 4. More generally, other regulation circuits capable of implementing the desired operation may be provided.

Further, the described embodiments may be adapted to the case where transistors T1 and T2 are transistors having a positive threshold voltage variation.

Further, embodiments of oscillators with a differential LC resonator have been described hereabove. The above-described embodiments may however be adapted to oscillators having a non-differential LC resonator, that is, where the output oscillating signal of the oscillator is referenced to ground.

Figure 5:
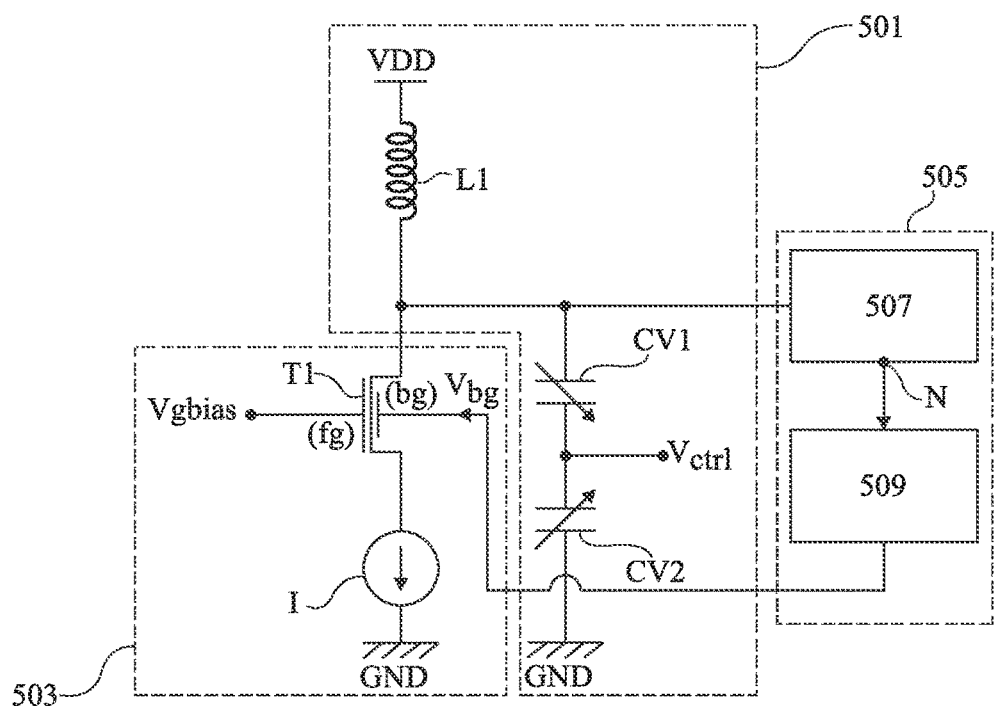
FIG. 5 is an electric diagram illustrating another embodiment of a class-C oscillator with a LC resonator.

FIG. 5 is an electric diagram illustrating an embodiment of a class-C oscillator with a non-differential LC resonator.

The oscillator of FIG. 5 comprises an LC resonator 501 comprising an inductance L1 having a first end coupled to a node $V_{DD}$ of application of a fixed (DC) power supply voltage and having its second end coupled to an output node $V_{out1}$ of the oscillator. Resonator 501 further comprises two variable-capacitance capacitive elements CV1 and CV2, for example, series-coupled variable-capacitance capacitors. More particularly, in the shown example, capacitive element CV1 has a first electrode coupled to node $V_{out1}$ and a second electrode connected to a first electrode of capacitive element CV2, and capacitive element CV2 has a second electrode coupled to a node GND of application of a reference potential of the oscillator, for example, the ground. The values of the capacitances of elements CV1 and CV2 vary according to a control voltage applied to a control node $V_{ctrl}$ of the resonator, in the shown example, the junction point of elements CV1 and CV2.

The oscillator of FIG. 5 further comprises an amplifier circuit 503 coupled to the LC resonator. Circuit 503 comprises a MOS transistor T1, in the shown example, an N-channel transistor. Transistor T1 couples node $V_{out1}$ to node GND via its conduction nodes. More particularly, in the shown example, the drain of transistor T1 is connected to node $V_{out1}$ and the source of transistor T1 is coupled to node GND by a current source i. In the same way as in the examples of FIGS. 3 and 4, transistor T1 is a dual-gate transistor. The front gate (fg) of transistor T1 is coupled to a node $V_{gbias}$ of application of a DC bias voltage.

The oscillator of FIG. 5 further comprises a regulation circuit 505 coupled, on the one hand, to output node $V_{out1}$ of the oscillator and, on the other hand, to the back gate (bg) of transistors T1. As circuit 305 of FIGS. 3 and 4, circuit 505 is capable of applying to the back gate (bg) of transistor T1 a DC bias voltage $V_{bg}$ which is a function of the amplitude of the oscillations of the output signal of the oscillator. In the shown example, sub-circuit 505 comprises a rectifying and filtering circuit 507, connected to node $V_{out1}$ and capable of delivering, on an output node N, a voltage representative of the envelope of the oscillating signal present on node $V_{out1}$. Circuit 507 is for example identical or similar to circuit $307_1$ described in relation with FIGS. 3 and 4. Circuit 505 further comprises a shaping circuit 509 connected to node N and capable of applying, to the back gate (bg) of transistor T1, a bias voltage which is a function of the amplitude of the envelope signal delivered by envelope detector 507 on node N. Circuit 509 is for example identical or similar to circuit $309_1$ described in relation with FIGS. 3 and 4.

The operation of the oscillator of FIG. 5 is similar to the above-described operation of the differential oscillators. Amplifier circuit 503 behaves as a negative resistor coupled with resonator 501, supplying power to resonator 501 to compensate for the inner resistance thereof. In steady state, amplifier circuit 503 ensures the holding of the oscillations of resonator 501, output node $V_{out1}$ delivering an AC voltage referenced to ground, having a frequency equal to the resonance frequency of resonator 501. A DC bias voltage $V_{gbias}$ is applied to the gate of transistor T1 (via node $V_{gbias}$). Voltage $V_{gbias}$ is preferably selected to be greater than or equal to minimum threshold voltage $V_{thmin}$ of transistor T1, so that transistor T1 has a class-B, -AB, or -A biasing at the starting of the oscillator. When the oscillator starts, an oscillating signal appears on its output node $V_{out1}$. Circuit 505 then continuously modifies the bias voltage $V_{bg}$ applied to the back gate of transistor T1 according to the oscillation amplitude. In steady state, voltage $V_{bg}$ reaches its minimum value $V_{bgmin}$, and the threshold voltage of transistor T1 accordingly reaches its maximum value $V_{thmax}$. The fixed bias voltage $V_{gbias}$ applied to the front gate of transistor T1 is selected to be smaller than maximum threshold voltage $V_{thmax}$ of transistor T1, to obtain a class-C biasing of transistor T1 in steady state.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A voltage-controlled oscillator, comprising:
a voltage-controlled LC resonator comprising at least one first output node;
an amplifier comprising at least one first dual-gate MOS transistor comprising first and second gates, coupling the first output node to a node of application of a reference potential;
a regulation circuit capable of applying to the second gate of the first dual-gate MOS transistor a bias voltage variable according to the amplitude of the oscillations of a signal delivered on the first output node of the oscillator; and
a circuit of application of a fixed bias voltage to the first gate of the first dual-gate MOS transistor,
wherein the fixed and variable bias voltages are such that the amplifier has a class-A, -B, or -AB biasing during a start-up phase of the oscillator, and has a class-C biasing in steady state,
wherein said at least one first dual-gate MOS transistor is an FDSOI transistor the first gate of the first dual-gate MOS transistor being a front gate of the FDSOI transistor and the second gate of the first dual-gate MOS transistor being a back gate of the FDSOI transistor.

2. The oscillator of claim 1, wherein:
the first dual-gate MOS transistor is a transistor having a negative threshold voltage variation; and
the variable bias voltage decreases as the amplitude of the oscillations increases.

3. The oscillator of claim 2, wherein the fixed bias voltage is greater than or equal to the minimum threshold voltage of the first dual-gate MOS transistor, and is smaller than the maximum threshold voltage of the first dual-gate MOS transistor.

4. The oscillator of claim 1, wherein the regulation circuit comprises a first circuit capable of supplying a first voltage representative of the envelope of the oscillations, and a second circuit capable of generating the variable bias voltage from the first voltage.

5. The oscillator of claim 4, wherein the first circuit comprises a diode-assembled MOS transistor in series with a capacitive element between the first output node and the node of application of the reference potential.

6. The oscillator of claim 5, wherein the second circuit comprises first and second resistors series-connected between first and second electrodes of the capacitive element, and a third resistor series-connected with a MOS transistor between a node of application of a power supply voltage and the node of application of the reference potential, the gate of this transistor being coupled to the junction point of the first and second resistors, and the junction point of the third resistor and of the third transistor being coupled to the second gate of the first dual-gate MOS transistor.

7. The oscillator of claim 1, wherein the resonator comprises an inductance, and a series association of first and second variable-capacitance capacitive elements.

8. The oscillator of claim 1, wherein:
the LC resonator is a differential resonator further comprising a second output node;
the amplifier comprises at least one second dual-gate MOS transistor comprising first and second gates, coupling the second output node to the node of application of the reference potential; and
the regulation circuit is capable of applying said variable bias voltage to the second gate of the second dual-gate MOS transistor.

9. The oscillator of claim 8, wherein the amplifier comprises first and second capacitive elements respectively coupling the first gate of the first dual-gate MOS transistor to the second output node and the first gate of the second dual-gate MOS transistor to the first output node.

10. The oscillator of claim 9, wherein:
said at least one second dual-gate MOS transistor is an FDSOI transistor, the first gate of the second dual-gate MOS transistor being a front gate of the FDSOI transistor and the second gate of the second dual-gate MOS transistor being a back gate of the FDSOI transistor;
the circuit of application of the fixed bias voltage applies the fixed bias voltage to the first gate of the second dual-gate MOS transistor;
the fixed and variable bias voltages are such that the fixed bias voltage is greater than or equal to the threshold voltage of the first and second dual-gate MOS transistors during a start-up phase of the oscillator, and is lower than the threshold voltage of the first and second dual-gate MOS transistors in a steady state phase, the variation of the threshold voltage of the first and second dual-gate MOS transistors between the start-up phase and the steady state phase resulting from the variation of the variable bias voltage between said phases.

11. A voltage-controlled oscillator, comprising:
a voltage-controlled LC resonator comprising at least one first output node;
an amplifier comprising at least one first dual-gate MOS transistor comprising first and second gates, coupling the first output node to a node of application of a reference potential;
a regulation circuit capable of applying to the second gate of the first dual-gate MOS transistor a bias voltage variable according to the amplitude of the oscillations of a signal delivered on the first output node of the oscillator; and
a circuit of application of a fixed bias voltage to the first gate of the first dual-gate MOS transistor,
wherein the fixed and variable bias voltages are such that the amplifier has a class-A, -B, or -AB biasing during a start-up phase of the oscillator, and has a class-C biasing in steady state,
wherein the resonator comprises an inductance, and a series association of first and second variable-capacitance capacitive elements.

12. The oscillator of claim 11, wherein said at least one first dual-gate MOS transistor is an FDSOI transistor, the first gate being a front gate of the FDSOI transistor and the second gate being a back gate of the FDSOI transistor.

13. A voltage-controlled oscillator, comprising:
a voltage-controlled LC resonator comprising at least one first output node;
an amplifier comprising at least one first dual-gate MOS transistor comprising first and second gates, coupling the first output node to a node of application of a reference potential;
a regulation circuit capable of applying to the second gate of the first dual-gate MOS transistor a bias voltage variable according to the amplitude of the oscillations of a signal delivered on the first output node of the oscillator; and
a circuit of application of a fixed bias voltage to the first gate of the first dual-gate MOS transistor,
wherein the fixed and variable bias voltages are such that the amplifier has a class-A, -B, or -AB biasing during a start-up phase of the oscillator, and has a class-C biasing in steady state,
wherein:
the LC resonator is a differential resonator further comprising a second output node;
the amplifier comprises at least one second dual-gate MOS transistor comprising first and second gates, coupling the second output node to the node of application of a reference potential; and
the regulation circuit is capable of applying said variable bias voltage to the second gate of the second dual-gate MOS transistor.

14. The oscillator of claim 13, wherein said at least one first dual-gate MOS transistor and said at least one second dual-gate MOS transistor are FDSOI transistors, the first gates of the first and second dual-gate MOS transistors being front gates of the FDSOI transistors and the second gates of the first and second dual-gate MOS transistors being back gates of the FDSOI transistors.

* * * * *